(12) United States Patent
Rowe et al.

(10) Patent No.: US 8,419,980 B2
(45) Date of Patent: Apr. 16, 2013

(54) TERNARY THERMOELECTRIC MATERIAL CONTAINING NANOPARTICLES AND PROCESS FOR PRODUCING THE SAME

(75) Inventors: Michael Paul Rowe, Pinckney, MI (US); Li Qin Zhou, Ann Arbor, MI (US)

(73) Assignee: Toyota Motor Engineering and Manufacturing North America, Erlanger, KY (US)

( * ) Notice: Subject to any disclaimer, the term of this patent is extended or adjusted under 35 U.S.C. 154(b) by 0 days.

(21) Appl. No.: 13/094,479

(22) Filed: Apr. 26, 2011

(65) Prior Publication Data

US 2012/0273735 A1    Nov. 1, 2012

(51) Int. Cl.
*H01B 1/02*    (2006.01)
(52) U.S. Cl.
USPC ..... 252/512; 136/200; 252/518.1; 252/519.4; 252/519.5; 252/521.3
(58) Field of Classification Search ......... 136/200; 252/512, 518.1, 519, 519.5, 521.3
See application file for complete search history.

(56) References Cited

U.S. PATENT DOCUMENTS

| | | |
|---|---|---|
| 5,448,109 A | 9/1995 | Cauchy |
| 6,670,539 B2 | 12/2003 | Heremans et al. |
| 7,262,361 B2 | 8/2007 | Hara et al. |
| 7,309,830 B2 | 12/2007 | Zhang et al. |
| 7,342,169 B2 | 3/2008 | Venkatasubramanian et al. |
| 7,355,238 B2 | 4/2008 | Takata et al. |
| 7,586,033 B2 | 9/2009 | Ren et al. |
| 8,044,292 B2 * | 10/2011 | Xiao et al. ............ 136/200 |
| 2006/0102224 A1 | 5/2006 | Chen et al. |
| 2008/0087314 A1 | 4/2008 | Xiao et al. |
| 2008/0173344 A1 | 7/2008 | Zhang et al. |
| 2009/0004086 A1 | 1/2009 | Kuhling et al. |
| 2009/0293928 A1 | 12/2009 | Liang et al. |
| 2010/0163091 A1 | 7/2010 | Liu et al. |
| 2010/0215852 A1 | 8/2010 | Rowe et al. |

OTHER PUBLICATIONS

U.S. Appl. No. 13/309,294, filed Dec. 1, 2011, Rowe, et al.
U.S. Appl. No. 13/309,321, filed Dec. 1, 2011, Rowe, et al.
U.S. Appl. No. 13/309,272, filed Dec. 1, 2011, Rowe, et al.

* cited by examiner

*Primary Examiner* — Khanh Tuan Nguyen
(74) *Attorney, Agent, or Firm* — Oblon, Spivak, McClelland, Maier & Neustadt, L.L.P.

(57) ABSTRACT

A thermoelectric material that comprises a ternary main group matrix material and nano-particles and/or nano-inclusions of a Group 2 or Group 12 metal oxide dispersed therein. A process for making the thermoelectric material that includes reacting a reduced metal precursor with an oxidized metal precursor in the presence of nanoparticles.

21 Claims, 12 Drawing Sheets

US 8,419,980 B2

TERNARY THERMOELECTRIC MATERIAL CONTAINING NANOPARTICLES AND PROCESS FOR PRODUCING THE SAME

FIELD OF THE INVENTION

The invention relates to a thermoelectric material that comprises a ternary main group matrix material and nanoparticles and/or nanoinclusions, and a process for making the thermoelectric material.

BACKGROUND OF THE INVENTION

Thermoelectric materials and devices may be utilized to obtain electrical energy from a thermal gradient. Current thermoelectric materials have a limited thermoelectric conversion efficiency which may be defined in terms of the formula $$ZT = S^2 \gamma / \kappa \times T.$$

The ZT of the above formula or figure of merit is related to the macroscopic transport parameters of the material including the Seebeck coefficient S, the electrical conductivity $\gamma$ and the thermal conductivity $\kappa$.

In order to improve the thermoelectric conversion efficiency one may increase the Seebeck coefficient and electrical conductivity while lowering the thermal conductivity. Increasing the ZT is difficult as the three parameters S, $\gamma$ and $\kappa$ are interrelated. For example, doping of a specific material may increase the electrical conductivity while decreasing the Seebeck coefficient and increasing the thermal conductivity. There is therefore a need in the art for a material having a ZT improved over conventional materials. There is also a need in the art for increasing the thermoelectric conversion by increasing or maintaining the Seebeck coefficient and electrical conductivity while lowering a thermal conductivity.

Nanostructured materials may be utilized to produce thermoelectric nanoparticles and materials for a thermoelectric composite materials. However, such nanostructured materials may be difficult and expensive to manufacture and may be difficult to process to four a composite material. Conventional thermoelectric nanostructured materials and processes for producing the same are unable to provide enhanced thermoelectric conversion efficiency. Additionally, conventional processes for producing thermoelectric nanoparticles are not cost efficient, or scalable, and do not produce thermoelectric composites having improved properties that overcome the technical problems associated with conventional thermoelectric nanoparticles and thermoelectric composite materials.

SUMMARY OF THE INVENTION

In one aspect the invention includes a thermoelectric material comprising a ternary matrix material and nano-particle inclusions. Representative examples of the nanoparticles include particles of materials having formula MO and/or M wherein M is a Group 2 or 12 element in a 2+ oxidation state. The matrix material is a ternary main group or chalcogenide semiconductor material preferably including elements Bi, Sb and Te, and preferably of formula $(BiSb)_2Te_3$. In other examples, the semiconductor matrix material may be an alloy of bismuth telluride and a further element (e.g., an element providing enhanced electroconductivity), or other material having an appreciable thermoelectric effect in bulk. Examples of the present invention include thermoelectric materials with high figures of merit, which can be used in thermoelectric devices having high conversion efficiency.

Another aspect of the invention includes a process for making a thermoelectric material. The process includes mixing a metal precursor with one or more other metal precursors in the presence of nanoparticles. The mixture of metal precursors may include one or more reduced metals and one or more oxidized metals. Mixing the reduced and oxidized metals forms a ternary mixture of main group metals in which the nanoparticles are dispersed.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE INVENTION

Figure 1:
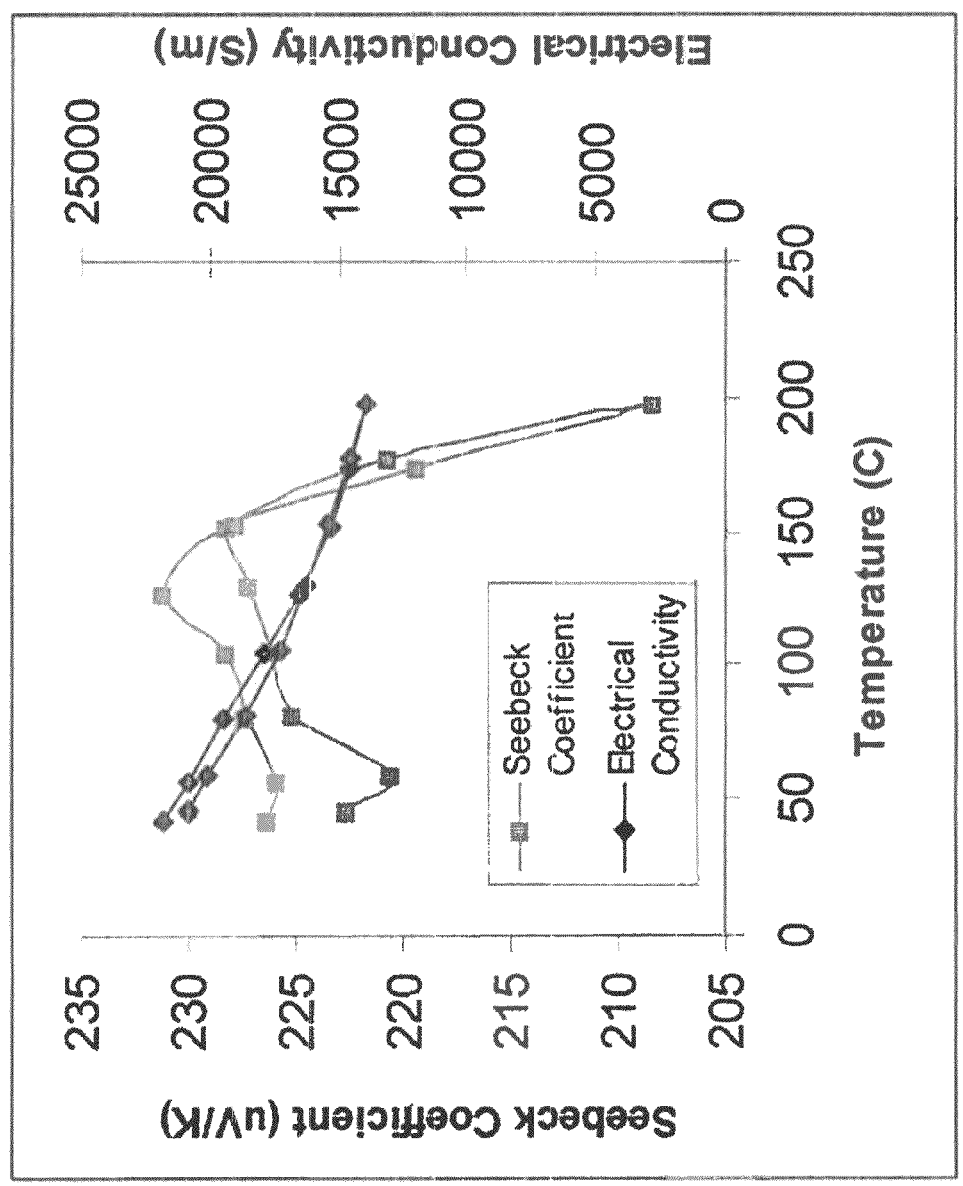
FIG. 1 describes the Seebeck coefficient and electrical conductivity of an embodiment of the invention in which the thermoelectric material is $(BiSb)_2Te_3$ and the nanoparticles are ZnO.

Referring now to the drawings, wherein like reference numerals designate identical or corresponding parts throughout the several views.

The invention includes a thermoelectric material that comprises a ternary main group matrix material and nanoparticles and/or nanoinclusions. Representative examples of the nanoparticles include particles of materials having formula MO and/or M wherein M is a Group 2 or 12 element in a 2+ oxidation state or in metallic form. The matrix material is a ternary main group or chalcogenide semiconductor material preferably including elements Bi, Sb and Te and preferably of formula $(BiSb)_2Te_3$. The semiconductor matrix material may be an alloy of bismuth telluride and a further element (e.g., an element providing enhanced electroconductivity), or other material having an appreciable thermoelectric effect in bulk. The thermoelectric material includes materials having high figures of merit and which can be used in thermoelectric devices having high conversion efficiency.

The invention further includes a process for making the thermoelectric material. The process includes carrying out the reduction of one or more metal precursors with one or more other metal precursors in the presence of nanoparticles. The process can be carried out in an aqueous medium with readily available, optionally water stable, metals, metal compounds and reactants.

The term "bulk thermoelectric material" refers to a material that has appreciable thermoelectric behavior in a homogeneous hulk form. Such materials may be included in a thermoelectric material. Unless otherwise indicated, the term "thermoelectric material" is used to refer to a thermoelectric material according to an embodiment of the present invention. Such thermoelectric materials are exemplary, and should not be used to restrict the scope of the invention, which is defined by the claims.

The term "ceramic" is used to refer to inorganic, non-metallic materials, typically electrical insulators or semi-conductors, including compounds formed between metallic and nonmetallic elements such as aluminum and oxygen (e.g. alumina, $Al_2O_3$), calcium and oxygen (e.g. calcium oxide, CaO). Ceramics also include compounds formed between silicon and nitrogen (e.g. silicon nitride, $Si_3N_4$), silicon and oxygen $SiO_2$), and silicon and carbon (e.g. silicon carbide), and the like. As used herein, the term ceramic can also refer to glasses. The term ceramic is not limited to materials formed by a firing process. Ceramics can be used in various illustrative examples described herein, such as silica (silicon oxide) based matrix materials. However, it should be understood that other electrically insulating or low thermal conductivity materials can be used, such other oxides, nitrides, oxynitrides, carbides, silicides, borides, and the like.

The term "nanoparticle" is used to identify the particles having a particle size of 1-200 nm.

"Nano-inclusions" are nanoparticles dispersed throughout a matrix material. In this invention, nanoinclusions refers to ceramic nanoparticles dispersed throughout a thermoelectric matrix.

A "dopant" is a material added to or mixed with a semiconductor material for the purpose of modulating the electrical properties of the semiconductor material. Dopants include n-type dopants which add negative charges to the semiconductor structure and p-type dopants which add positive charge to the semiconductor structure. Dopants include metals such as Sb and metal complexes or meta precursors such as antimony salts and organometallic antimony salts.

The term "semiconductor" as used here includes doped semiconductors. A ternary semiconductor is a material having a bulk structure that comprises at least three main metals and which exhibits semiconductor properties.

The ternary semiconductor matrix material of the thermoelectric material of the invention may be chosen based on the desired operating temperature range required. Semiconductor matrix materials include bismuth antimony telluride and its alloys, bismuth-antimony-tellurium compounds (which may be referred to as bismuth-antimony-tellurium alloys or bismuth antimony telluride), and other ternary tellurides sometimes referred to a metal-doped ternary tellurides. The semiconductor matrix material may include, optionally, any semiconducting selenide or telluride in a minor amount, e.g., in an amount of less than 50% by weight based on the total weight of the semiconductor matrix material.

In one embodiment of the invention the thermoelectric material includes a ternary semiconductor matrix material that is doped with another metal. The doping metal is preferably an electrical conducting metal. The doping metal may be present as one of the three metals of the ternary mixture of metals or may be present in addition to the three metal which make up the major portion of the semiconductor matrix material.

A thermoelectric material comprising nanoparticles can provide an improved thermoelectric figure of merit, compared with the figure of merit of a bulk sample of the semiconductor matrix material. The enhancement may be due to the combination of low thermal conductivity, high electrical conductivity, and high Seebeck coefficient.

A figure of merit, Z, for a thermoelectric material may be defined as $Z=S^2\sigma/\gamma$, in terms of Seebeck coefficient (S), electrical conductivity ($\sigma$), and thermal conductivity ($\kappa$). An alternative dimensionless figure-of-merit is ZT, as Z varies with temperature. For a typical homogeneous bulk thermoelectric material, such as alloys of bismuth telluride and antimony, ZT is 1 or less. The figure of merit may be improved by increasing S and/or $\sigma$, and/or lowering $\kappa$. However, for a homogeneous bulk material, thermal conductivity and electrical conductivity are often correlated, so that increasing electrical conductivity also increases thermal conductivity, and the effects of both increases tend to cancel out in the figure of merit.

Quantum confinement effects due to the restricted dimensions of certain core-shell particles can further increase the figure of merit of the inventive thermoelectric material. The thermoelectric materials according to the present invention may therefore further include core-shell particles. Such core-shell particles are described, for example, in U.S. 2008/00087314 which is incorporated herein by reference in its entirety.

A thermoelectric material according to the present invention may have a high electrical conductivity ($\sigma$) due to interconnecting semiconductor network (or other electrical conductor, such as metal), such as shells of core-shell particles. Optionally, the thermoelectric material may have an enhanced value of Seebeck coefficient (S) due to the enhancement of the density of states near the Fermi level arising from quantum confinement effects. The thermoelectric material may at the same time have a low value of thermal conductivity $\kappa$ compared to a bulk homogeneous sample of the matrix material, e.g., because of the lower thermal conductivity of the core material compared with the matrix material. The thermal conductivity may be further reduced due to increased phonon scattering by the nanoparticles and/or nano-inclusions, and possibly boundaries such as phase or crystalline transitions existing within the material. Hence, a nanocomposite thermoelectric material including nano-inclusions or other inclusions may have higher figure of merit, ZT, than a bulk sample of the material.

Conventional thermoelectric materials typically have a dimensionless figure of merit ZT less than 1 in bulk, and any such material may be used as a material in an example of the present invention.

FIG. 1 describes the Seebeck coefficient and electrical conductivity of an embodiment of the invention in which the ternary semiconductor material is $(BiSb)_2Te_3$ and the nanoparticles are ZnO. The thermoelectric material described in FIG. 1 was subjected to sintering at 400° C. and 100 MPa for 4 hours. FIG. 1 demonstrates the desirable drop in Seebeck coefficient at temperatures above 150° C. Concurrently the electrical conductivity decreases with rising temperature in a manner that trends downward. The thermoelectric material of the invention thus provides a material having an abrupt decrease in Seebeck coefficient at above 150° C. and a downward trending electrical conductivity at rising temperatures.

Figure 2:
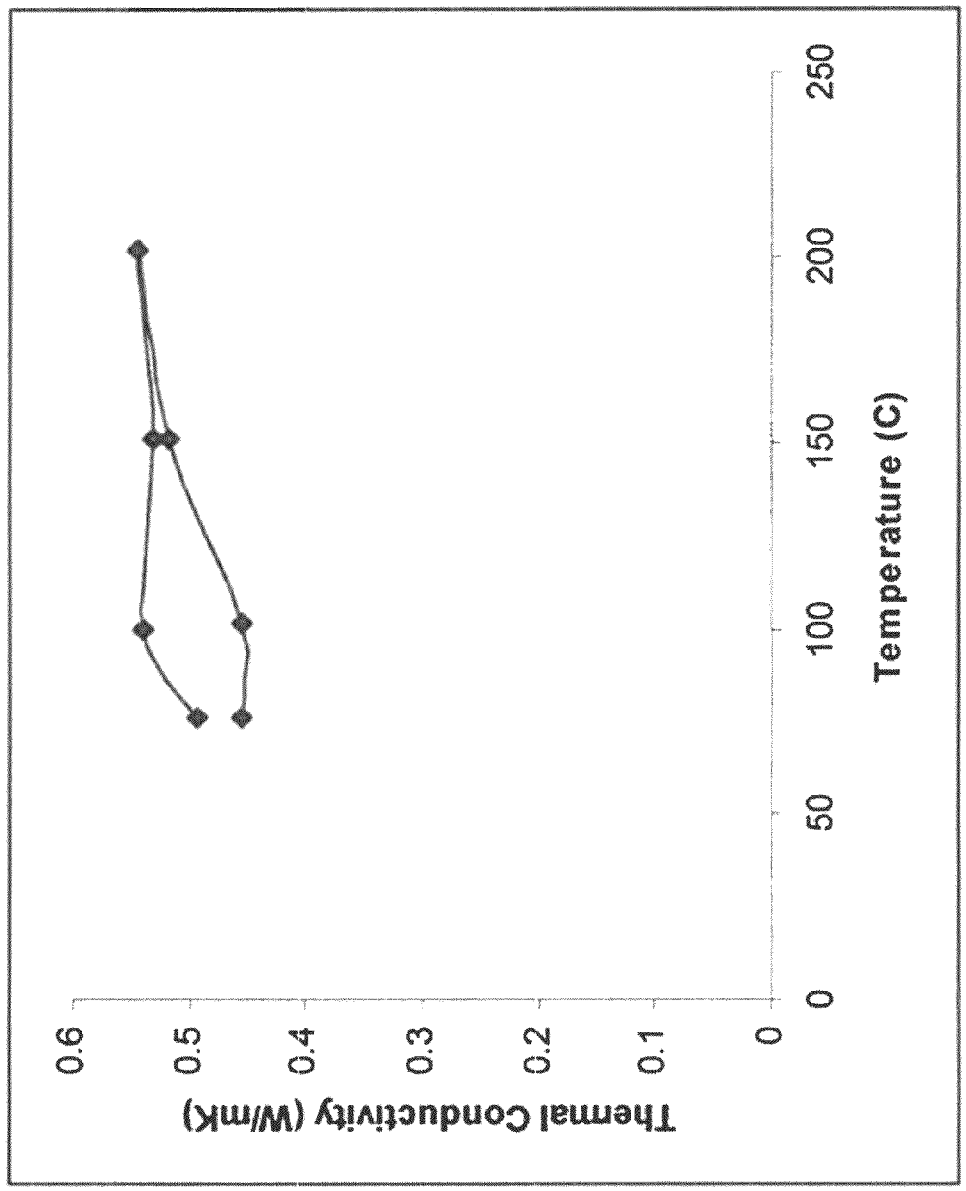
FIG. 2 describes the thermal conductivity of a thermoelectric material of an embodiment of the invention.

FIG. 2 describes the thermal conductivity of a thermoelectric material of the invention. The ternary semiconductor material described in FIG. 2 is of formula $(BiSb)_2Te_3$. The nanoparticles present in the thermoelectric material are ZnO. The thermoelectric material was made by sintering a precipitate at 400° C. and 100 MPa for 4 hours. The thermal conductivity of the thermoelectric material of the invention shown in FIG. 2 increases as temperature increases.

In one embodiment the thermoelectric material comprises a nanostructure network of the ternary semiconductor matrix material arranged around the nanoparticles. For example, the ternary semiconductor matrix may be an alloy of bismuth tellurium and antimony, and/or other material having a dimensionless figure of merit $ZT \cong 1$ in bulk. The nanoparticle preferably has a low value of thermal conductivity, and can, for example, be an electrical insulator or poor electrical conductor. The nanoparticle need not be a thermoelectric material or a semiconductor material, in that a bulk sample of the second material need not show a useful (or even appreciable) thermoelectric effect in a bulk sample.

For example, the ternary semiconductor matrix can be a nanostructured network. The nanostructured network may comprise nanowires, for example in an interconnected network including nanowires. The interconnected network can be three dimensional. Examples include a nanostructured hulk thermoelectric material comprising hexagonal or cubic semiconductor nanowire or nanomesh arrays within a ceramic matrix.

The nanostructure may also include particles, or other structures having a feature size (such as nanowire or nanoparticle diameter) in the nanometer (or nanoscale) range, for example, approximately 0.5-1000 nm, for example in the range 2-20 nm. All ranges are inclusive of given limits. The terms mesoscale, mesopore, mesoporous and the like, as used in this specification, refer to structures having feature sizes in the range 5 nm-100 nm. No particular spatial organization or method of manufacture is implied by the term mesoscale as used here. Hence, a mesoporous material includes pores, which may be ordered or randomly distributed, having a diameter in the range 5 nm-100 nm, whereas a nanoporous material includes pores having a diameter in the range 0.5-1000 nm.

The nanoparticle is preferably a particle that is made from a composition of formula MO where M is a Group 2 or Group 12 element (i.e., Be, Mg, Ca, Sr, Ba, Ra, Zn, Cd and/or Hg). The nanoparticle is preferably of homogeneous character and/or optionally includes an outer layer of material of different compositions.

In preferred embodiments of the invention the nanoparticle has a unimodal particle size distribution. In other embodiments of the invention the nanoparticle has a multimodal particle distribution. The nanoparticle may thus include a first nanoparticle having a first average or mean particle size and a second nanoparticle of a second average or mean particle size. The particle sizes of the first and second particles may vary by 0.1-5, 0.5-2.5, 1-1.5 wherein the upper limit of the range represents the multiple by which the particle size diameter of the lower particle must be multiplied in order to obtain the particle size of the larger particle. The lower limit of the aforementioned ranges represents a multiplier by which the particle size of the larger diameter particle is multiplied to obtain the particle size of the smaller sized particle.

The nanoparticles dispersed in the semiconductor matrix material may be of different geometry, e.g., shape. In one embodiment the nanoparticles are essentially spherical having a degree of spherecity measured according to the Wadell formula $(\psi = (\pi^{1/3}(6V_p)^{2/3})/A_p)$ where $V_p$ is the volume of the nanoparticle and $A_p$ is the surface area of the particle. The sphericity of nanoparticles particles is preferably from 0.95 to 0.99 and may range, for example, from 0.90 to 0.99. The nanoparticles may also be of irregular shape such as ellipsoidal, tetrahedral, cubic or other polyhedral shape.

In another embodiment of the invention the nanoparticle is surface treated by physical or chemical treatment. Physical treatment includes, for example, a smoothing or roughening treatment. Smoothing may be carried out by forming a slurry of the nanoparticles in a carrier fluid in the presence of a grinding particle such that the surface of the nanoparticles is smoothened by the treatment. Such treatment may likewise be used to generate a nanoparticle having a greater degree of sphericity. The surface treatment may include treating the nanoparticles with a high intensity discharge such as that formed by corona or by contact of the nanoparticle with a plasma.

In other embodiments of the invention the thermoelectric material and/or semiconductor matrix material can contain one or more fillers in addition to the nanoparticles. Examples of filler materials include conductivity enhancing and/or dampening materials such as stable solid materials, metal, ceramic, carbon, polymer, or combination thereof. Filler materials also include air or voids (for example, an air-filled semiconductor matrix, e.g., a hollow shell, or foam-like semiconductor matrix having a plurality of voids).

An example thermoelectric device according to an embodiment of the present invention includes a first electrical contact, a second electrical contact, and a thermoelectric material located within an electrical path between the first electrical contact and the second electrical contact. The thermoelectric material includes nanoparticles dispersed in a matrix material.

Figure 3:
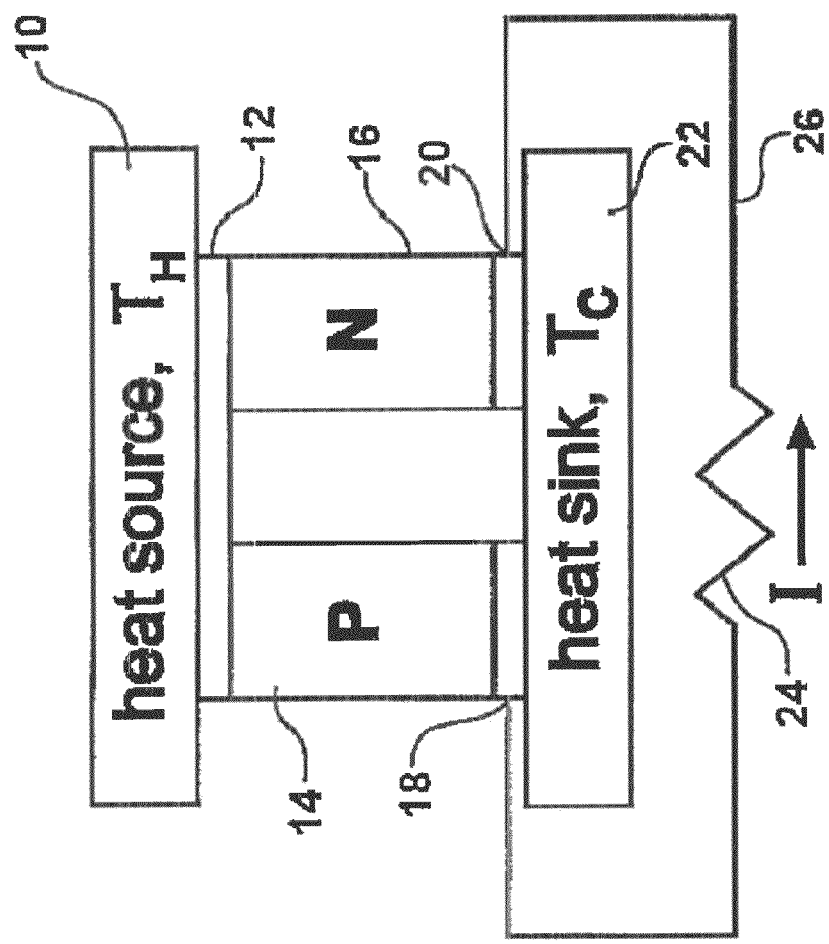
FIG. 3 shows a configuration of a thermoelectric device using an improved thermoelectric material according to an example of the present invention.

FIG. 3 illustrates a configuration of a thermoelectric device using an improved thermoelectric material according to an example of the present invention.

The device includes heat source 10, first electrically conducting layer 12, first thermoelectric material 14, second thermoelectric material 16, first electrical contact 18, second electrical contact 20, heat sink 22, and resistive load 24 connected to the thermoelectric device through electrical lead 26. When heat is provided by the heat source $(T_H > T_C)$, current is generated in the direction shown in FIG. 3. Hence, this thermoelectric device is a Seebeck thermoelectric device, producing an electrical output from a heat input.

In this example, the first thermoelectric material includes an n-type semiconductor, and the second thermoelectric material includes a p-type semiconductor. The first thermoelectric material and/or the second thermoelectric material comprise a thermoelectric nanocomposite including nanoinclusions such as MO nanoparticles. In an example where the first thermoelectric material includes nanoparticles, the semiconductor matrix material may comprise an n-type semiconductor, and in an example where the second thermoelectric material includes nanoparticles, the semiconductor matrix material may comprise a p-type semiconductor.

A similar configuration may be used to obtain Peltier heating or cooling, where an electrical potential is applied between the first and second electrical contacts so as to generate a thermal gradient in the device. For conciseness, this specification discusses the Seebeck effect (electricity obtained from thermal inputs), but in general the same considerations, such as figure of merit ZT, apply equally to Peltier device applications.

The improvement in figure of merit can influence the performance of the thermoelectrical device containing the thermoelectric material. A typical thermoelectric device is built up from several unicouples, which are typically pairs of thermally conductive p-type (P) and n-type (N) semiconductors. These unicouples are connected electrically in series and thermally in parallel. Theoretically, the maximum efficiency of the conversion of heat energy to electrical energy is given by:

$$\zeta_{max} = \frac{(T_H - T_C)}{T_H} \frac{\sqrt{1 + ZT_{ave}} - 1}{\sqrt{1 + ZT_{ave}} + T_C/T_H}$$

where $T_{ave}=(T_H+T_C)/2$ is the average temperature, and Z is a figure of merit, defined as $Z=S^2\sigma/\kappa$. The figure of merit Z depends on the macroscopic transport parameters of the materials, namely the Seebeck coefficient (S), electrical conductivity ($\sigma$), and thermal conductivity ($\kappa$). A large figure of merit is provided by a thermoelectric material having a large Seebeck coefficient, high electrical conductivity, and low thermal conductivity.

Figure 4:
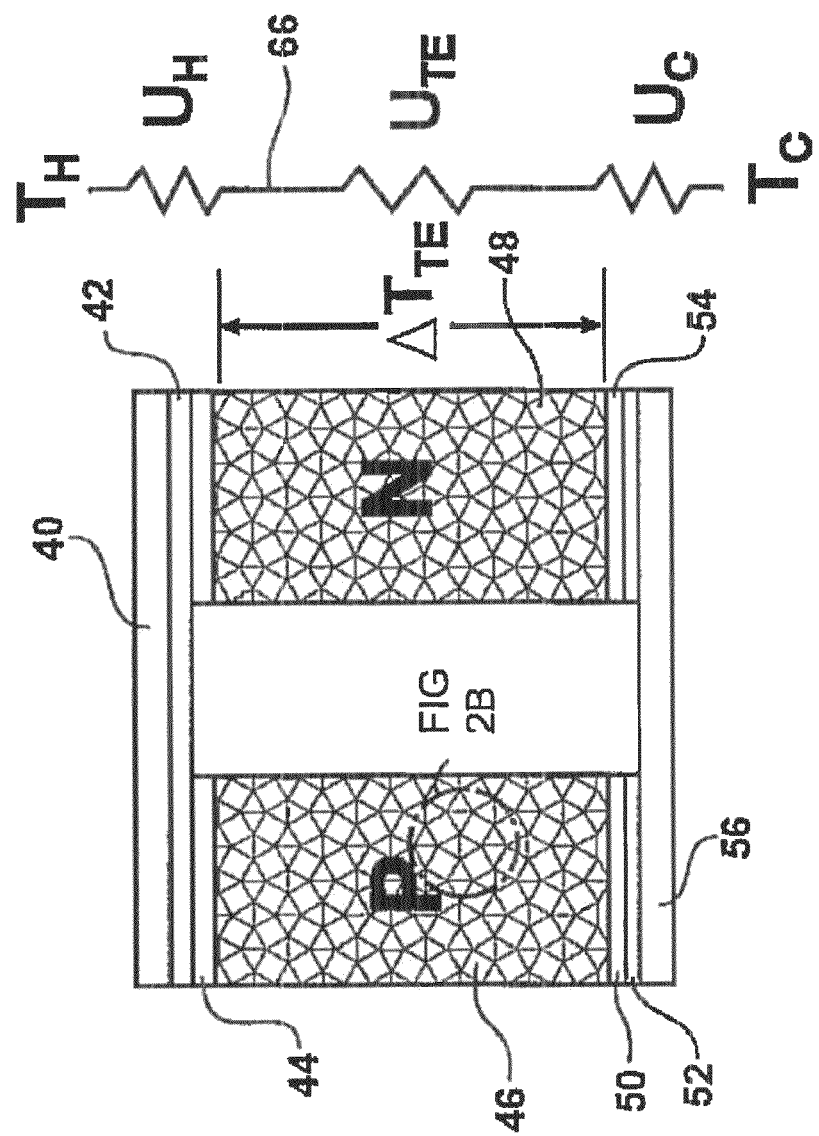
FIG. 4 shows a thermoelectric unicouple.

FIG. 4 shows a thermoelectric device, in this case a thermoelectric unicouple including a first ceramic layer 40, which can be placed in thermal communication with a heat source, metal layer 42, first and second thermoelectric materials 46 and 48, having nickel electrical pads such as 44, first and second electrical contacts 52 and 54 respectively, and second ceramic layer 56, which can be placed in thermal communication with a heat sink. The thermoelectric materials each includes a semiconductor matrix material in which a plurality of nanoparticles or nanoinclusions are present, which form a conducting network shown schematically in this figure.

FIG. 4 also shows a thermal circuit 66 corresponding to this unicouple which contains the thermal resistances for the transfer of heat from the hot reservoir $U_H$, to the cold reservoir $U_C$, and through the thermoelectric legs $U_TE$. $U_TE=L/\sigma A$ where L is the length of the legs, A is the cross-sectional area and a is the thermal conductivity. $U_H$ and $U_C$ contain the thermal resistance of the ceramic plate, as well as the coefficient of heat transfer from the hot side and to the cold reservoir.

The semiconductor matrix material of the thermoelectric material of the invention is essentially homogeneous with respect to composition. The nanoparticles are preferably uniformly dispersed in the semiconductor matrix material. The nanoparticles, when uniformly dispersed, fowl a thermoelectric material that is essentially homogeneous with respect to the appearance of nanoparticles and/or nanoinclusions therein. Uniform dispersion of the nanoparticles in the semiconductor matrix material can be confirmed by enemy-dispersive X-ray spectroscopy (e.g., EDX, EDAX, EDS). Likewise, contrast resolution of Zn in the thermoelectric material confirm that there are no or a minimum number of agglomerations of nanoparticles in the thermoelectric material (see FIGS. 7-11).

In one embodiment of the invention the thermoelectric material is made by dispersing the nanoparticle in the semiconductor matrix material and/or by altering or inducing inclusions in the semiconductor matrix material. The nanoparticle is preferably dispersed within the semiconductor matrix material using a wet chemical method, e.g., using an aqueous and/or organic solution or suspension of materials.

In a preferable embodiment the synthesis of the thermoelectric material is carried out only in aqueous media and in the substantial absence of an organic solvent and/or an organic additive such as a surfactant and/or a dispersant.

In a preferable embodiment of the invention a reduced metal precursor, e.g., a metalide such as a telluride, is formed before the metal, e.g., tellurium, is mixed with any other components of the semiconductor matrix material. A telluride is a complex of Te metal in which a negative charge resides on the metal center, e.g., the metal atom is in a super-reduced state. The telluride may be formed by reacting the metal, e.g., tellurium metal, with a reducing agent to form an intermediate material such as $NaTeBH_4$ and/or NaTeH (i.e., sodium hydrogen telluride). In other embodiments tellurium precursors other than tellurium metal may be reacted with a reducing agent to form a telluride. Other tellurium precursors include oxides, halides, chalcogenides, hydroxides, and/or alkoxides of tellurium. In a preferable embodiment of the invention tellurium metal powder is reacted with a reducing agent under alkaline aqueous conditions to form the telluride. For example, tellurium metal is suspended in an alkaline medium such as water (adjusted to alkaline pH by mixing with a base such as NaOH). A reducing agent is then mixed with the tellurium metal and/or tellurium precursors.

Preferably the reducing agent is added to the tellurium metal and/or tellurium precursors to form the telluride. The reducing agent is preferably sodium borohydride. In other embodiments of the invention a telluride is formed by reducing a tellurium precursor with any reducing agent such as hydrazine, hydrogen gas, lithium-aluminum hydride, lithium borohydride, sodium hydride and the like. The reduction to form the telluride is preferably carried out in an aqueous dispersion medium that is not susceptible to reduction or reaction with the reducing agent at ambient conditions.

It is especially preferred that the metalide, e.g., telluride, is mixed with an aqueous dispersion or solution of bismuth and/or antimony compounds, each having an oxidation state of +1 or greater. In this embodiment of the invention the telluride acts to reduce the bismuth and antimony materials to form a tellurium-based, bismuth/antimony-containing semiconductor matrix material. The reduction may be carried out in the presence of "nanoparticles" to form a robust semiconductor matrix material having desirable thermal conductivity and thermoelectric properties.

In a particular embodiment of the invention a tellurium metal powder is suspended in an aqueous medium which preferably consists of a reaction mixture containing only tellurium metal powder (or other metal powder), water and an alkaline agent such as NaOH. A reducing agent such as sodium borohydride is mixed with the reaction mixture under an inert gas atmosphere. The resulting suspension is allowed to mix at ambient temperature. Preferably the tellurium metal suspension is cooled prior to mixing with the reducing agent. Mixing the reducing agent to tellurium metal powder may result in an exothermic reaction which forms a precipitate and evolves hydrogen gas.

In a most preferred embodiment of the invention the thermoelectric matrix material is formed by reduction of one or more higher oxidation state precursors to form one or more of the elements of the ternary semiconductor matrix material. Even more preferably the reduction is carried out such that each component of the semiconductor matrix material is present during the reducing. Most preferably each component of the semiconductor matrix material is present during the reducing and, in addition, the nanoparticle is present. In this embodiment of the invention the reduction of the metal complexes having an oxidation state of +1 or greater is conducted in a single step, e.g., by mixing the metalide with all of the metal complexes in a single reactor.

Separately from the formation of the telluride, a precursor mixture comprising one, two or a plurality of the precursors of the other components of the ternary semiconductor material (e.g., the complexes of metes having an oxidation state of +1 or greater) are combined to form a suspension or solution in an alkaline aqueous medium to thereby form a second and, optionally third etc., precursor mixture(s). The precursor mixture preferably contains precursors of all of the other materials of the ternary semiconductor matrix and is desirably degassed and maintained under an inert gas atmosphere. Preferable precursors include alkoxide and carboxylate compounds such as bismuth citrate and potassium antimony tartrate. The precursors may be used in molar ratios corresponding to the desired composition of the semiconductor matrix material. Preferably the precursor mixture includes the nanoparticles, more preferably the entire amount of the nanoparticles of the thermoelectric material are present in the precursor mixture.

Mixing the precursor mixture with the reduced metal mixture (metalide, e.g., telluride) results in reduction of the precursors, e.g., reduction of metal complexes such as the bismuth citrate and potassium antimony tartrate precursor compounds. The reduction is caused by reaction of the telluride and, optionally, residual amounts of reducing agent present in the reduced metal mixture, with the bismuth and antimony precursors. Side products include salts and soluble organic compounds such as citric acid and tartaric acid. The reaction of the reduced metal mixture with the precursor mixture(s) is carried out in the presence of the nanoparticles. The resulting reaction mixture is allowed to react at ambient temperature and/or elevated temperature up to about 50° C.

Prior to mixing the precursor mixture with the reduced metal precursor, the reduced metal precursor is desirably filtered, decanted and/or washed to separate any precipitate and/or unreacted tellurium metal.

The semiconductor matrix material formed by the reduction reaction of the first and second precursor mixtures precipitates as a solid material upon reduction of the precursors with the reduced metal. Side products such as citric acid, tartaric acid and salts can be removed from the reaction mixture by decanting and washing the resultant precipitate with water or an alkaline washing agent such as an aqueous composition containing a polar organic material and a base such as ammonium hydroxide. The semiconductor matrix material is optionally further separated from supernatant liquid by settling and/or centrifugation. To further purify the washed, collected and optionally dried precipitate, a step of extraction with, for example, an aqueous alcohol and/or aqueous alkaline solution is carried out. Preferably the extraction and washing are carried out at least partially with a Soxhlet extraction device under an inert atmosphere.

In a preferred embodiment of the invention no suspending or dispersing agents are present in the first reduced metals, the precursor mixture and/or any reaction mixture derived therefrom.

The washed, extracted semiconductor material is subsequently dried, e.g., under a flow of dry nitrogen or inert gas, and further preferably under action of sonification. An optional step of sieving the resultant free flowing powder may be carried out to obtain a desirable particle size. Preferably sieving is carried out to obtain a free flowing powder passing through a 50 micron, preferably 35 micron sieve.

The resultant sieved material is sintered at a temperature of up to 500° C., preferably up to 450° C., 400° C., 350° C. or 300° C., in the absence of oxygen. The sintering may cause chemical and/or physical changes to the semiconductor matrix material whereby the structure is annealed and/or crystal structure orientation or reorientation occurs. Prior to sintering the powder may be pressed into a desired form.

The resultant sintered material has the appearance of a metallic object and is air stable although subject to surface oxidation. A shiny, brittle metallic-like material is obtained having an electrical conductivity of between 1,000 and 200,000 S/m.

Figure 5A:
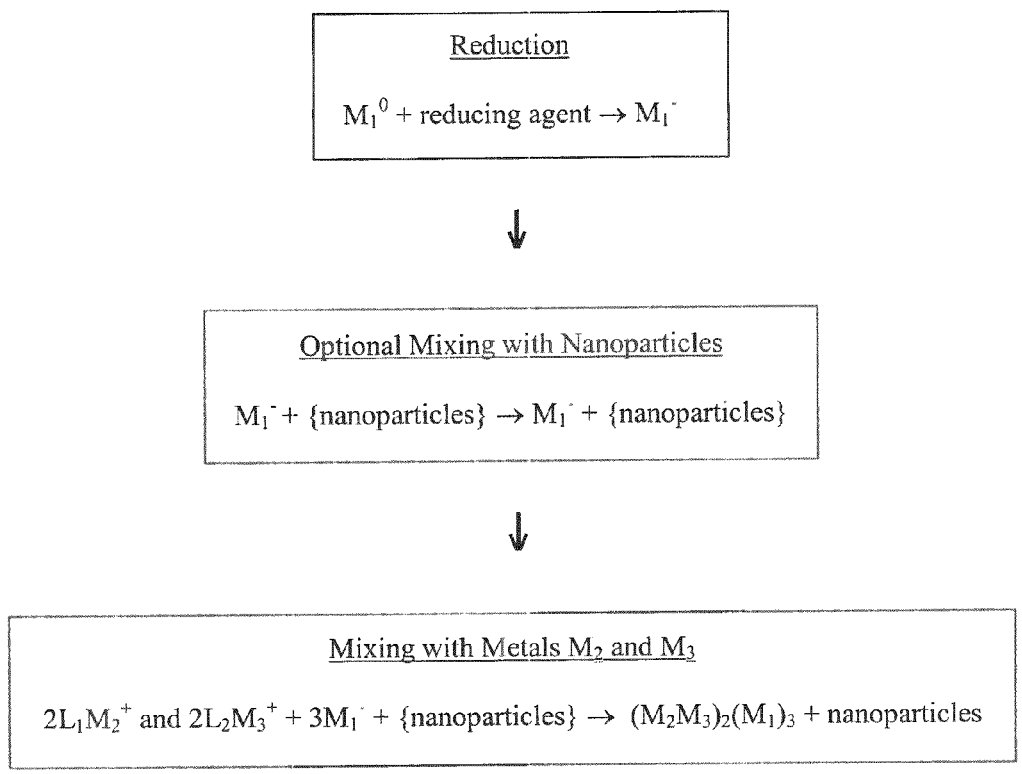
FIGS. 5A and 5B show flow diagrams of the synthetic steps involved in forming the thermoelectric material in embodiments of the invention.
Figure 5B:
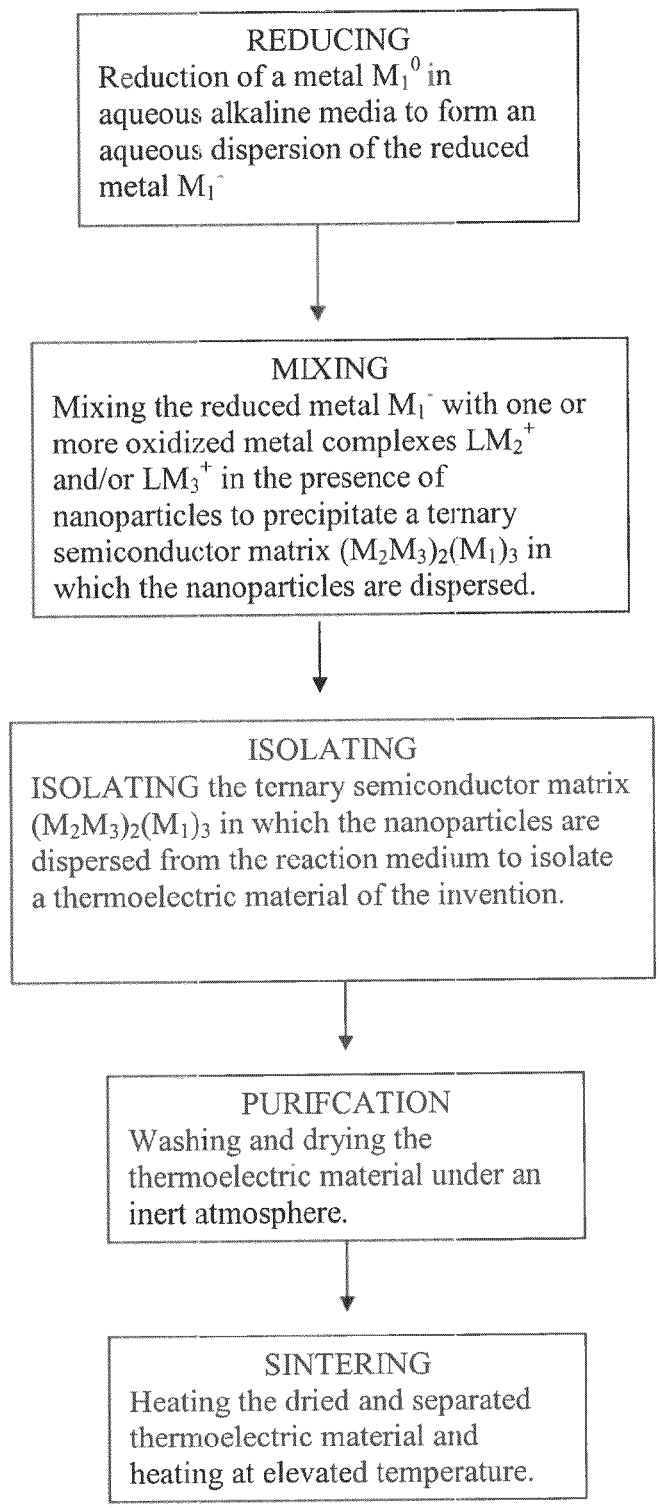

FIGS. 5A and 5B provide high level flow diagrams of processes for making thermoelectric materials of the invention. The process of the invention is illustrated by reference to FIG. 5A which shows a flow diagram of the synthetic steps involved in forming the thermoelectric material in one embodiment of the invention. In FIG. 5A elemental metal that is neither reduced nor oxidized is identified as $M_\#^0$. Metals that are reduced and oxidized are depicted as $M_\#^-$ and $M_\#^+$, respectively. Reduced and oxidized metals may have an oxidation state that is −1, −2, −3, −4, and +1, +2, +3, +4, respectively.

The flowchart of FIGS. 5A and 5B demonstrate the synthesis of a thermoelectric material based on a ternary chalcogenide semiconductor matrix material containing nanoparticles. The ternary semiconductor matrix material is described as comprising at least three elements, i.e., $M_1$, $M_2$ and $M_3$. In a preferred embodiment of the invention each of the metals $M_1$, $M_2$ and $M_3$ are main group metals of groups 13, 14, 15 and/or 16 of the Periodic Table. In a particularly preferred embodiment of the invention the metals $M_1$, $M_2$ and $M_3$ are tellurium, antimony and bismuth, respectively. In other embodiments of the invention the steps used to make the thermoelectric material of the invention may include additional metals such as alkaline earth metals and transition metals together with metals $M_1$, $M_2$ and $M_3$ in any of the steps represented in the flow diagram in FIGS. 5 and 6.

In one embodiment a first metal $M_1$ is reduced to form a reduced metal composition. In one embodiment of the invention the metal $M_1$ is suspended in a water-based dispersion medium. The water-based dispersion medium is preferably an alkaline aqueous matrix that includes only water and an alkaline agent such as NaOH and excludes organic solvents, surfactants and/or dispersants. The metal $M_1^0$ may include small amounts of a corresponding oxidized counterpart. For example, the metal $M_1$ can be used in the form of a metallic powder, i.e., particles of metal, which may have a layer of surface oxidation. Such a metallic powder is nonetheless described as $M_1^0$ because it is comprised mainly of the metal in its elemental and unoxidized and/or unreduced form, e.g., a majority of the metal atoms are in the native metallic state having an oxidation state of zero. Preferably at least 80 mol %, 90 mol %, or 95 mol % of the metal M is in its metallic unoxidized and/or wired used state when it is suspended in a water-based alkaline dispersion medium. Dispersion of the metal $M_1^0$ in the alkaline dispersion medium preferably does not lead to any reaction between the $M_1^0$ metal with water or any alkaline agent. Preferably the dispersing is carried out under an inert atmosphere such that oxygen is not present during mincing and/or dispersing.

In a subsequent step a reducing agent is mixed with the $M_1^0$ aqueous dispersion. The reducing agent is mixed with an amount sufficient to reduce all of the $M_1$ metal to an overall negative charge, i.e., $M_1^-$. In the context of the present invention a reduced metal $M_1$ is a metal that may be present in the form of a complex such as $HM_1X$ where X is a counter ion such as a $Na^+$ and the like. The product formed by mixing the metal powder with a reducing agent is the reduced metal powder identified as $M_1^-$ in FIGS. 5A and 5B. The thus-formed reduced metal composition is preferably isolated from any precipitate by decantation of supernatant liquid to separate the reduced metal $M_1^-$ from any precipitate formed during the reducing step. As mentioned above the reducing of the $M_1^0$ metal is preferably carried out in an alkaline dispersing medium.

The reduced metal $M_1^-$ is optionally mixed with nanoparticles. The nanoparticles may be added to or mixed with the reduced metal $M_1^-$ after the metal $M_1$ is in a completely reduced form and has been filtered from any precipitate. Alternately, the nanoparticles may be present in the dispersion of $M_1^0$ prior to the addition of the reducing agent or added concurrently with the reducing agent to the dispersion of the $M_1^0$ metal. Preferably the nanoparticles are mixed with the reduced metal only under conditions under which the reduced metal and the reducing agent will not reduce the nanoparticles. The nanoparticles may be any of the nanoparticle materials discussed herein. In one embodiment of the invention the nanoparticles are added to the $M_1^-$ dispersion in the form of an aqueous dispersion that is alkaline or slightly alkaline.

In a further step of the process for making the thermoelectric material, the dispersion containing the reduced metal $M_1^-$ and, optionally the nanoparticles, is mixed with a dispersion of one or more of the other metals or compounds comprising the metals forming the ternary semiconductor matrix material and preferably containing the nanoparticles. The reduced $M_1^-$ dispersion may be added independently to the metals $M_2$ and/or $M_3$. In a preferred embodiment the reduced metal $M_1^-$ is added to a mixture that contains an aqueous dispersion of both metals $M_2$ and $M_3$ where the $M_2$ and $M_3$ are present as compounds having an oxidation state of +1 or greater. In a preferable embodiment of the invention, described in FIGS. 5A and 5B, the metals $M_2$ and $M_3$ are each in an oxidized form, i.e., $M_2^+$ and $M_3^+$. The reduced metal dispersion $M_1^-$ may be added preferably to a single aqueous dispersion containing both $M_2$ and $M_3$. Preferably all of the metal of metals $M_2$ and $M_3$ are present in an oxidized state. In an oxidized state identified as $M_\#^+$ the core metal may be in an oxidation state of +1, +2, +3, or +4, or a mixture of said oxidation states. The reduced metal is added to the aqueous dispersions of $M_2$ and $M_3$ in a molar amount corresponding to the stoichiometry of the desired ternary semiconductor matrix material. For example, if the desired semiconductor matrix material is of formula $(M_2M_3)_2(M_1)_3$, three molar equivalents of $M_1^-$ is mixed with two molar equivalents of each of metals $M_2$ and $M_3$, independently or at the same time.

The metals $M_2$ and $M_3$ are complexes of a ligand (L) that may be the same or different in comparison to $M_2$ and $M_3$. The ligand may be covalently or ionically bonded to the metal $M_2$ and/or $M_3$. In another embodiment of the invention the ligand L is bonded covalently and/or ionically bonded and thither is coordinated to the metal center of $M_2$ and/or $M_3$ as a dative bond in a Lewis acid/base sense complex.

Preferably one or all of the precursor compositions which contain the $M_2$ and $M_3$ metals contain the nanoparticles. In another embodiment of the invention the nanoparticles are minced with the metalide before reaction with the $LM_2$ and/or $LM_3$ metal complexes.

Mixing the oxidized metal/metals $M_2$ and $M_3$ with the reduced metal $M_1$ in the presence of the nanoparticle forms a precipitated ternary semiconductor matrix in which the nanoparticles are dispersed. In this form the ternary semiconductor matrix is suspended in an aqueous medium that is alkaline and contains side products of the reduction of the metals $M_2$ and/or $M_3$ by the reduced metal $M_1$. The side products are removed by allowing the precipitate to settle from solution, e.g., by centrifugation, and decanting any supernatant liquid. The thus-formed precipitate is further washed with water, an alkaline medium, and/or a polar organic solvent. Washing and isolation of the thus-formed thermoelectric material is carried out in an inert atmosphere to avoid any re-oxidation of any of the metals $M_1$, $M_2$ and/or $M_3$.

The precipitate formed by the reduction is generally pulverulent in form. The powder may not, however, be of uniform particle size. The precipitate is dried, e.g., at ambient temperature by exposure to a flow of inert gas, under vacuum, and/or by heating. The dried precipitate is then preferably subjected to a step of sieving in which large and/or agglomerated precipitated materials are separated from a fine powder of the precipitant material. The thus-sieved precipitate material is then press molded and sintered at elevated temperature to form the thermoelectric material.

The steps of reducing metal $M_1$, suspending metals $M_2$ and/or $M_3$ in an aqueous medium, and reducing the oxidized metals $M_2$ and $M_3$ with the reduced form of metal $M_1$ are preferably carried out in aqueous alkaline media in the substantial absence of any organic solvent and/or surfactant. These steps are likewise preferably carried out under inert atmosphere such that any reduced metals $M_1$, $M_2$ and $M_3$ are not oxidized by ambient oxygen.

EXAMPLES

Example 1

In an oxygen-free environment, 5.9054 g of Te powder was allowed to react with 6.3151 g sodium borohydride in 103 mL water, for 15 hours.

Again in an oxygen-free environment, a solution of 9.0153 g potassium antimony tartrate and 1.5395 g bismuth citrate dissolved in 6.5 mL water and 5.5 mL of 28% ammonium hydroxide was added to 480 mL water. The reaction solution was stirred aggressively while an aqueous solution of zinc oxide nanoparticles was added.

The reaction solution was filtered through a flitted glass filter (still oxygen-free) into the vigorously stirring antimony/bismuth/zinc oxide solution. The solution was stirred for an additional 20 minutes and always kept under an oxygen-free environment. The solution was either centrifuged immediately to isolate the solid precipitate or allowed to settle, decanted, and then centrifuged to isolate the solid precipitate. This precipitate was washed with a solution of water, methanol, and ammonium hydroxide until any by-products were removed. The precipitate was then washed with methanol and dried under an inert gas stream while being subjected to ultrasonification. This dried powder was heated under vacuum at 100° C. for 15 mins., 200° C. for 20 mins., and finally 300° C. for 20 mins. The resulting powder was then hot pressed sintered at a temperature between 385 and 450° C. and for anywhere from 1-10 hours at 100 MPa to form a thermoelectric material.

Figure 6:
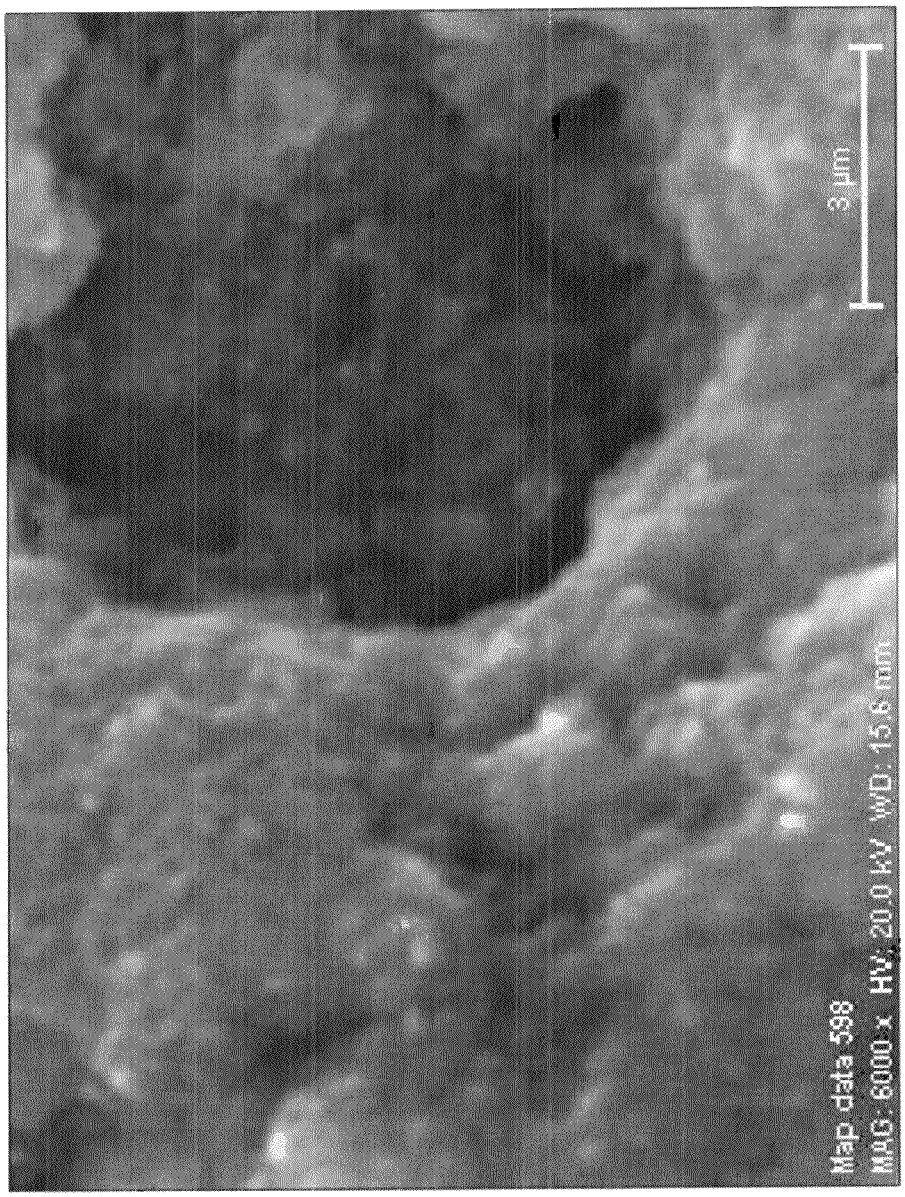
FIG. 6 shows a SEM of a thermoelectric material of the invention comprising a $(BiSb)_2Te_3$ matrix and ZnO nanoparticles.
Figure 7:
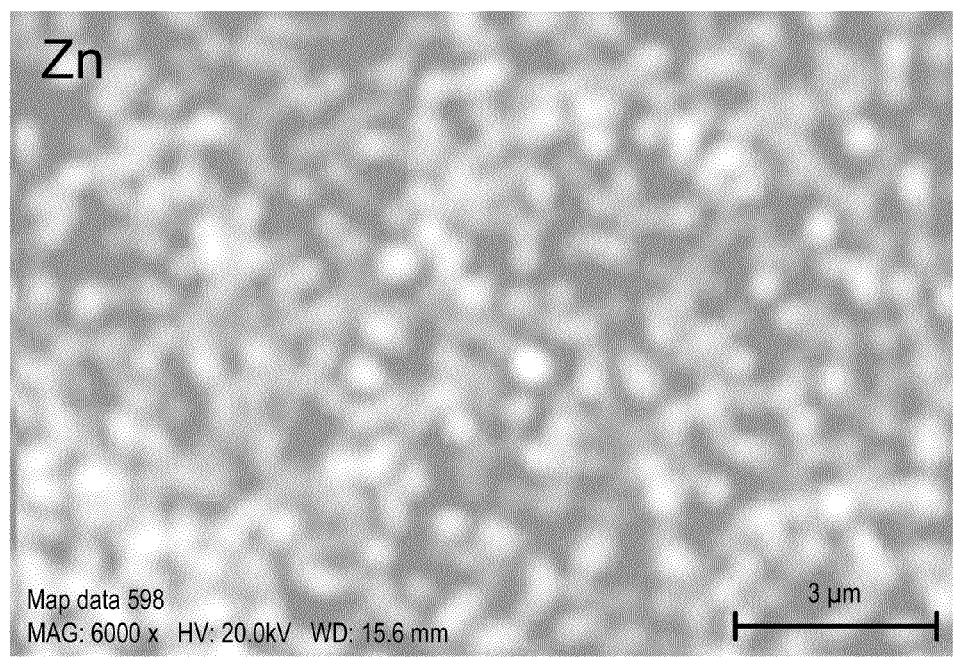
FIG. 7 shows EDS mapping of Zn in a thermoelectric material of the invention comprising a $(BiSb)_2Te_3$ matrix and ZnO nanoparticles.
Figure 8:
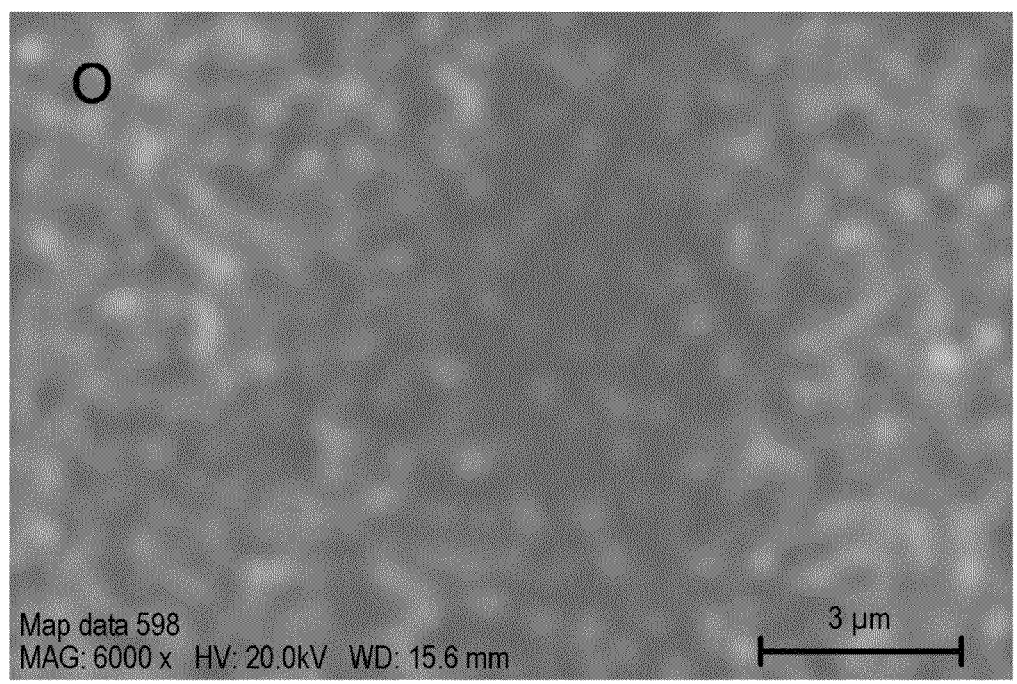
FIG. 8 shows EDS mapping of O in a thermoelectric material of the invention comprising a $(BiSb)_2Te_3$ matrix and ZnO nanoparticles.
Figure 9:
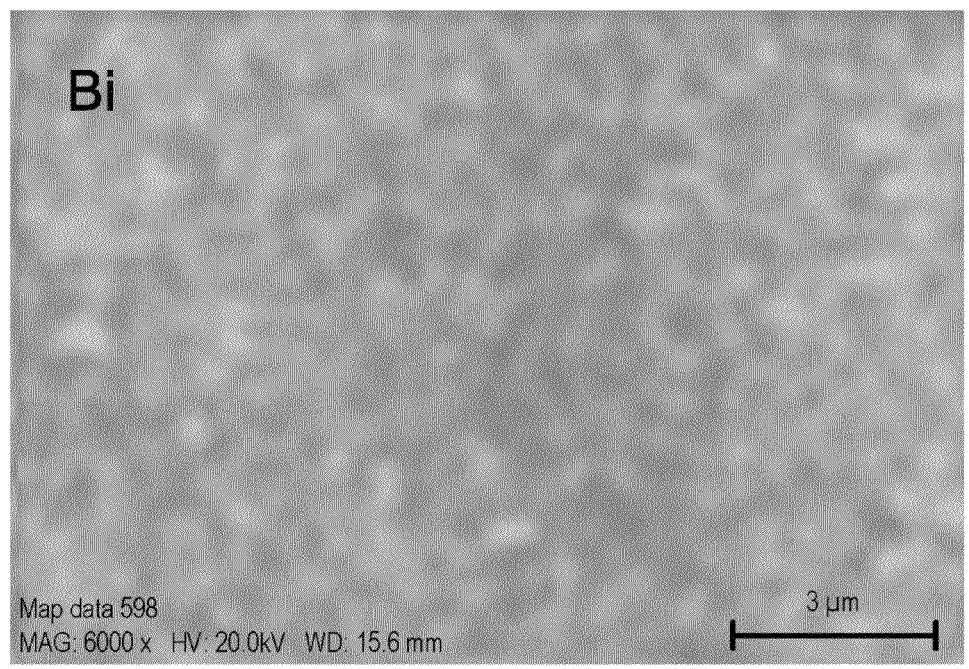
FIG. 9 shows EDS mapping of Bi in a thermoelectric material of the invention comprising a $(BiSb)_2Te_3$ matrix and ZnO nanoparticles.
Figure 10:
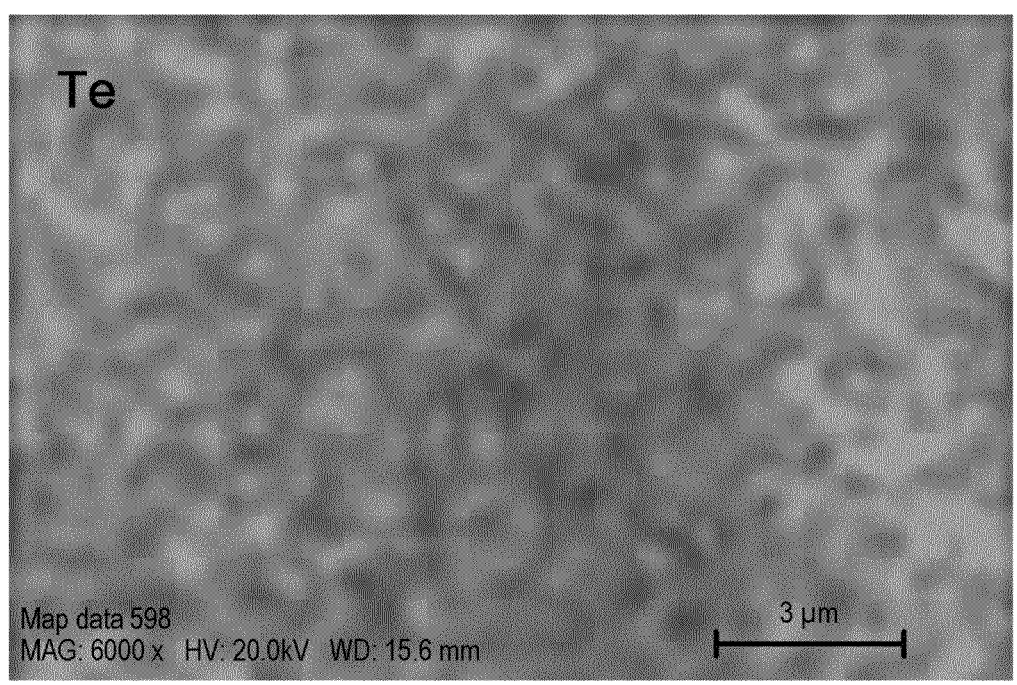
FIG. 10 shows EDS mapping of Te in a thermoelectric material of the invention comprising a $(BiSb)_2Te_3$ matrix and ZnO nanoparticles.
Figure 11:
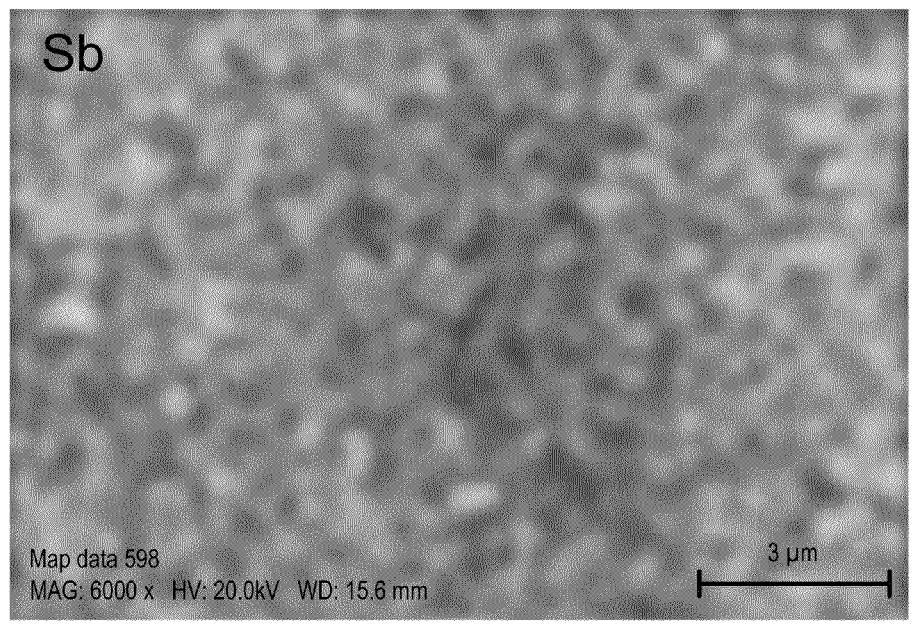
FIG. 11 shows EDS mapping of Sb in a thermoelectric material of the invention comprising a $(BiSb)_2Te_3$ matrix and ZnO nanoparticles.

FIG. 6 show a seagoing electron microscopy view of a thermoelectric material of the invention. FIGS. 7-11 provide SEM-EDS (scanning electron microscopy energy dispersive X-ray spectroscopy) profiles of a thermoelectric material of the invention of formula $(BiSb)_2Te_3$ containing ZnO nanoparticles. The SEM-EDS profiles show that the atoms of both the matrix material (i.e., Bi, Sb and Te) and the atoms of the nanoparticles (i.e., Zn and O) are uniformly dispersed in the thermoelectric material.

Obviously, numerous modifications and variations of the present invention are possible in light of the above teachings. It is therefore to be understood that within the scope of the appended claims, the invention may be practiced otherwise than as specifically described herein.

The invention claimed is:

1. A process for making a thermoelectric material, comprising:

first mixing a first oxidized main group metal compound with a second oxidized main group metal compound to form an oxidized main group metal mixture, second mixing at least one metal in the form of a reduced compound with the oxidized main group metal mixture, wherein the second mixing includes mixing at least three different metal compounds of main group metals, wherein the first mixing is carried out in water in the presence of nanoparticles of a material of formula MO where M is a group 2 or group 12 element of the Periodic Table.

2. The method of claim 1, further comprising:
forming the at least one reduced metal compound before the second mixing by reacting the metal in the form of a metal powder with one or more reducing agents in water.

3. The process of claim 1, further comprising:
washing a precipitate formed by the second mixing with at least one selected from the group consisting of an aqueous solution and an organic solution.

4. The process of claim 3, further comprising, drying the washed precipitate, then
press molding the washed precipitate, and
sintering the pressed washed precipitate to form a sintered ternary thermoelectric material comprising nanoparticles.

5. The process of claim 1, wherein the reduced metal compound is formed by reacting tellurium metal with sodium borohydride in an aqueous alkaline media.

6. The process of claim 1, wherein the first and the second oxidized main group metal compounds are in the form of at least one of a halide, alkoxide, carboxylate or mixtures thereof.

7. The process of claim 1, wherein the second mixing forms a ternary main group semiconductor material comprising the three main group metals, wherein the nanoparticles of the metal oxide are dispersed in the ternary main group semiconductor material.

8. The process of claim 7, wherein the three main group metals are Bi, Te and Sb.

9. The process of claim 7, wherein the ternary main group semiconductor material comprises $(BiSb)_2Te_3$.

10. The process of claim 7, wherein the ternary main group semiconductor material comprises $(BiSb)_2Te_3$ in an amount of at least 50% by weight based on the total weight of the ternary main group semiconductor material, and at least 50% by weight of the nanoparticles are particles of ZnO based on the total weight of the nanoparticles.

11. A process for making a thermoelectric material, comprising:

mixing at least one main group metal in the form of a reduced compound with at least one main group metal in the form of an oxidized compound, wherein the mixing includes mixing at least three different main group metal compounds, wherein at least two of the main group metal compounds are at least one of a citrate main group metal complex and a tartrate main group metal complex, wherein the mixing is carried out in water in the presence of nanoparticles of a material of formula MO where M is a Group 2 or Group 12 element of the Periodic Table.

12. The method of claim 11, further comprising:
forming the at least one reduced metal compound before the mixing by reacting the metal in the form of a metal powder with one or more reducing agents in water.

13. The process of claim 11, further comprising:
washing a precipitate formed by the mixing with at least one selected from the group consisting of an aqueous solution and an organic solution.

14. The process of claim 13, further comprising, drying the washed precipitate, then
press molding the washed precipitate, and
sintering the pressed washed precipitate to form a sintered ternary thermoelectric material comprising nanoparticles.

15. The process of claim 11, wherein the reduced metal compound is formed by reacting tellurium metal with sodium borohydride in an aqueous alkaline media.

16. The process of claim 11, comprising:
mixing an aqueous composition comprising two different oxidized main group metal compounds with the reduced metal compound.

17. The process of claim 16, wherein the oxidized main group metal compounds are in the form of at least one of a halide, alkoxide, carboxylate or mixtures thereof.

18. The process of claim 11, wherein the mixing forms a ternary main group semiconductor material comprising the three main group metals, wherein the nanoparticles of the metal oxide are dispersed in the ternary main group semiconductor material.

19. The process of claim 18, wherein the three main group metals are Bi, Te and Sb.

20. The process of claim 18, wherein the ternary main group semiconductor material comprises $(BiSb)_2Te_3$.

21. The process of claim 18, wherein the ternary main group semiconductor material comprises $(BiSb)_2Te_3$ in an amount of at least 50% by weight based on the total weight of the ternary main group semiconductor material, and at least 50% by weight of the nanoparticles are particles of ZnO based on the total weight of the nanoparticles.

\* \* \* \* \*